(12) United States Patent
Lee et al.

(10) Patent No.: US 11,121,178 B2
(45) Date of Patent: Sep. 14, 2021

(54) ELECTRONIC DEVICE AND METHOD FOR FABRICATING ELECTRONIC DEVICE

(71) Applicant: SK hynix Inc., Icheon (KR)

(72) Inventors: Hyun Jin Lee, Icheon (KR); Young Seok Ko, Suwon (KR); Jung Hun Lee, Suwon (KR); Hyun Min Lee, Sejong (KR)

(73) Assignee: SK hynix Inc., Icheon (KR)

( * ) Notice: Subject to any disclaimer, the term of this patent is extended or adjusted under 35 U.S.C. 154(b) by 21 days.

(21) Appl. No.: 16/670,498

(22) Filed: Oct. 31, 2019

(65) Prior Publication Data
US 2020/0365657 A1    Nov. 19, 2020

(30) Foreign Application Priority Data

May 17, 2019  (KR) ........................ 10-2019-0057764

(51) Int. Cl.
| | |
|---|---|
| *H01L 27/24* | (2006.01) |
| *H01L 27/22* | (2006.01) |
| *H01L 45/00* | (2006.01) |
| *H01L 23/532* | (2006.01) |
| *H01L 43/02* | (2006.01) |
| *H01L 23/528* | (2006.01) |
| *G11C 11/16* | (2006.01) |

(Continued)

(52) U.S. Cl.
CPC ........ *H01L 27/2463* (2013.01); *H01L 23/528* (2013.01); *H01L 23/53266* (2013.01); *H01L 27/224* (2013.01); *H01L 27/2418* (2013.01); *H01L 27/2427* (2013.01); *H01L 43/02* (2013.01); *H01L 45/1233* (2013.01); *H01L 45/1253* (2013.01); *G11C 11/161* (2013.01); *G11C 13/0004* (2013.01); *G11C 13/0007* (2013.01); *G11C 2213/31* (2013.01); *G11C 2213/32* (2013.01); *G11C 2213/52* (2013.01); *G11C 2213/72* (2013.01); *H01F 10/329* (2013.01); *H01F 10/3254* (2013.01); *H01L 45/06* (2013.01); *H01L 45/144* (2013.01); *H01L 45/146* (2013.01); *H01L 45/147* (2013.01)

(58) Field of Classification Search
CPC ............... H01L 27/2463; H01L 27/224; H01L 27/2418; H01L 27/2427; H01L 23/53266; H01L 23/528; H01L 45/1233; H01L 45/1253; H01L 45/146; H01L 45/147; H01L 45/06; H01L 43/02; G11C 11/161; G11C 13/0004; G11C 13/0007; G11C 2213/52; G11C 2213/72
USPC ..... 257/4, 3, 5, 421, 47, 112, 295, 530, 774, 257/E23.01, E27.073, E29.002, E29.323, 257/E21.002, E21.461, E47.005; 365/163, 148; 438/257, 483, 95
See application file for complete search history.

(56) References Cited

U.S. PATENT DOCUMENTS

| | | |
|---|---|---|
| 6,984,561 B2 | 1/2006 | Herner et al. |
| 8,404,514 B2 | 3/2013 | Lee et al. |
| 9,698,342 B2 * | 7/2017 | Ito .......................... H01L 27/228 |

(Continued)

*Primary Examiner* — Dao H Nguyen

(57) ABSTRACT

An electronic device may include a semiconductor memory. The semiconductor memory may include: row lines; column lines intersecting the row lines; memory cells located in intersection regions of the row lines and the column lines, the memory cells including upper and lower electrodes; and interface layers located between the lower electrodes of the memory cells and the row lines, the interface layers having a width narrower than that of the row lines.

20 Claims, 18 Drawing Sheets

(51) Int. Cl.
*H01F 10/32* (2006.01)
*G11C 13/00* (2006.01)

(56) References Cited

U.S. PATENT DOCUMENTS

| | | |
|---|---|---|
| 9,705,076 B2 * | 7/2017 | Nagamine ............. H01L 27/228 |
| 9,831,428 B2 | 11/2017 | Ravasio et al. |
| 2013/0043452 A1 * | 2/2013 | Meyer ................... H01L 45/147 |
| | | 257/4 |
| 2014/0063913 A1 * | 3/2014 | Kawashima ....... G11C 13/0069 |
| | | 365/148 |
| 2017/0271581 A1 * | 9/2017 | Seong ................. H01L 27/2427 |

* cited by examiner

180
ELECTRONIC DEVICE AND METHOD FOR FABRICATING ELECTRONIC DEVICE

CROSS-REFERENCE TO RELATED APPLICATION

The present application claims priority under 35 U.S.C. § 119(a) to Korean patent application number 10-2019-0057764, filed on May 17, 2019, in the Korean Intellectual Property Office, the entire disclosure of which is incorporated herein by reference.

BACKGROUND

1. Technical Field

The present disclosure generally relates to a memory circuit or device, and an application thereof in an electronic device.

2. Related Art

Recently, as electronic devices or appliances trend toward miniaturization, low power consumption, high performance, multi-functionality, and the like, electronic devices capable of storing information in various electronic devices or appliances such as a computer and a portable communication device have been developed. Thus, research has been conducted for semiconductor devices capable of storing data using a switching characteristic between different resistant states according to a voltage or current applied thereto. Examples of the semiconductor devices are a resistive random access memory (RRAM), a phase change random access memory (PRAM), a ferroelectric random access memory (FRAM), a magnetic random access memory (MRAM), an E-fuse, and the like.

SUMMARY

Embodiments relate to an electronic device capable of improving the operational characteristics and reliability of memory cells, and a method for fabricating the electronic device.

In accordance with an aspect of the present disclosure, there is provided an electronic device including a semiconductor memory, wherein the semiconductor device includes: row lines; column lines intersecting the row lines; memory cells located in intersection regions of the row lines and the column lines, the memory cells including upper and lower electrodes; and interface layers located between the lower electrodes of the memory cells and the row lines, the interface layers having a width narrower than that of the row lines.

In accordance with another aspect of the present disclosure, there is provided an electronic device including a semiconductor memory, wherein the semiconductor memory includes: row lines; column lines intersecting the row lines; memory cells located in intersection regions of the row lines and the column lines, the memory cells including upper and lower electrodes; and interface layers located between the lower electrodes of the memory cells and the row lines, the interface layers including a material having an etching rate higher than that of the row lines.

In accordance with still another aspect of the present disclosure, there is provided a method for fabricating an electronic device including a semiconductor memory, the method including: forming a conductive layer for interface layers on a conductive layer for row lines; forming a cell stack structure including a lower electrode layer and an upper electrode layer on the conductive layer for interface layers; forming cell patterns including upper and lower electrodes by etching the cell stack structure; and forming row lines and interface layers by etching the conductive layer for interface layers and the conductive layer for row lines, wherein the interface layers are located between the lower electrodes and the row lines, and have a width narrower than that of the row lines.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be thorough and complete, and will fully convey the scope of example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1A:
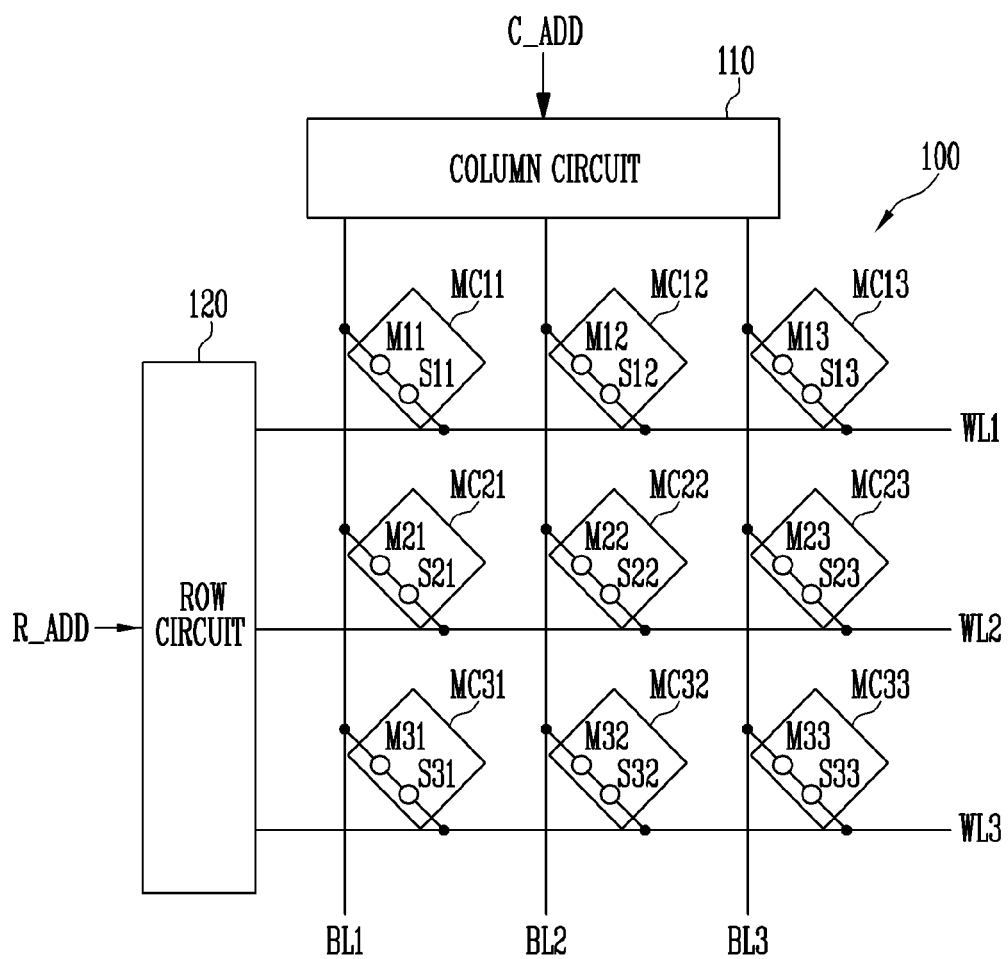
FIGS. 1A and 1B are views illustrating a structure of an electronic device in accordance with an embodiment of the present disclosure.

Hereinafter, various embodiments will be described in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative spatial relationship of such layers or the sequence of arranging the layers as shown reflects a particular implementation for the described or illustrated example and a different relative spatial relationship or sequence of arranging the layers may be possible. In addition, a described or illustrated example of a multi-layer structure may not reflect all layers present in that particular multilayer structure (e.g., one or more additional layers may be present between two illustrated layers). In a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate. Throughout the disclosure, like reference numerals refer to like parts throughout the various figures and embodiments of the present disclosure.

Figure 1B:
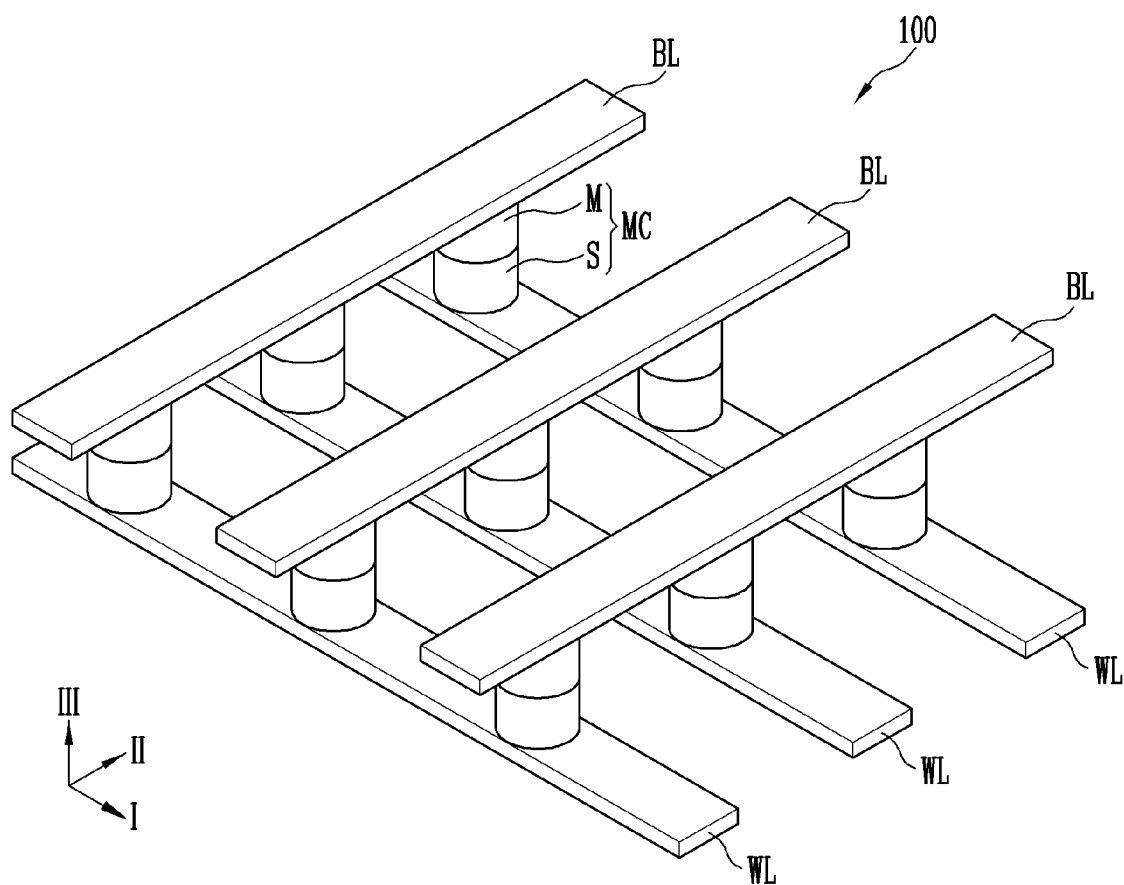

FIGS. 1A and 1B are views illustrating a structure of an electronic device in accordance with an embodiment of the present disclosure. FIG. 1A is a circuit diagram of a cell array 100, and FIG. 1B is a perspective view of the memory cell array 100.

Referring to FIG. 1A, the electronic device in accordance with the embodiment of the present disclosure may include a semiconductor memory, and the semiconductor memory may be a nonvolatile memory device or a variable resistance memory device. The semiconductor memory may include row lines and column lines intersecting the row lines. The row lines may be word lines, and the column lines may be bit lines. The word lines and the bit lines are relative concepts. The row lines may be bit lines and the column lines may be word lines. Hereinafter, a case where the row lines are word lines and the column lines are bit lines is assumed and described.

The cell array 100 may include memory cells MC11 to MC33 respectively disposed between column lines BL1 to BL3 and row lines WL1 to WL3. The memory cells MC11 to MC33 may be disposed at intersection points of the column lines BL1 to BL3 and the row lines WL1 to WL3. The memory cells MC11 to MC33 may include selection elements S11 to S33 and memory elements M11 to M33, which are connected in series, respectively. The selection elements S11 to S33 may be electrically connected to the row lines WL1 to WL3, respectively, and the memory elements M11 to M33 may be electrically connected to the column lines BL1 to BL3, respectively.

Each of the memory elements M11 to M33 may include a memory pattern as a storage node for storing data. For example, each of the memory elements M11 to M33 may include a variable resistance material such as a resistive material, a Magnetic Tunnel Junction (MTJ), or a phase change material. Each of the selection elements S11 to S33 may be used to select a memory cell MC, and include a switching material. Each of the selection elements S11 to S33 may be a diode, a PNP diode, a BJT, a Metal Insulator Transition (MIT) element, a Mixed Ionic-Electronic Conduction (MIEC) element, an Ovonic Threshold Switching (OST) element, or the like.

The shape and configuration of each of the memory cells MC11 to MC33 may vary according to embodiments. For example, the selection elements S11 to S33 may be omitted, or the positions of the selection elements S11 to S33 and the memory elements M11 to M33 may be reversed. That is, the selection elements S11 to S33 may be electrically connected to the column lines BL1 to BL3, and the memory elements M11 to M33 may be electrically connected to the row lines WL1 to WL3.

In addition, the semiconductor memory may further include a column circuit 110 for controlling the column lines BL1 to BL3 and a row circuit 120 for controlling the row lines WL1 to WL3.

The row circuit 120 may be a row decoder, a word line decoder, a word line driver, or the like. The row circuit 120 selects a single row line (e.g., the second row line WL2) from the row lines WL1 to WL3 according to a row address R_ADD. The column circuit 110 may be a column decoder, a bit line decoder, a bit line driver, or the like. The column circuit 110 selects a single column line (e.g., the second column line BL2) from the column lines BL1 to BL3 according to a column address C_ADD. Therefore, a single memory cell MC22 connected between the selected column line BL2 and the selected row line WL2 may be selected.

Although three column lines BL1 to BL3 and three row lines WL1 to WL3 are illustrated in FIG. 1A, this is merely for convenience of description, and embodiments of the present disclosure are not limited thereto. The numbers of the column lines BL1 to BL3 and the row lines WL1 to WL3, which are included in the cell array 100, may vary according to embodiments.

Referring to FIG. 1B, the memory cell array 100 may include column lines BL and row lines WL, which are located at different levels. The column lines BL may be located above the row lines WL or be located under the row lines WL. The row lines WL may each extend in a first direction I, and the column lines BL may each extend in a second direction II intersecting the first direction I.

Memory cells MC may be respectively disposed at intersection points of the column lines BL and the row lines WL. Each of the memory cells MC may have a stack structure, and include a memory element M and a selection element S, which are stacked in a third direction III. The third direction III is a direction intersecting the first direction I and the second direction II, and may be a direction perpendicular to a plane defined by the first direction I and the second direction II.

The column lines BL, the memory cells MC, and the row lines WL may constitute one deck. Although a case where the memory cell array has a single-deck structure is illustrated in FIG. 1B, embodiments of the present disclosure are not limited thereto, and the memory cell array may further include one or more additional decks. The memory cell array may have a multi-deck structure in which row lines WL and column lines BL are alternately stacked in the third direction III. Therefore, stacked decks may share the row lines WL or the column lines BL.

Figure 2A:
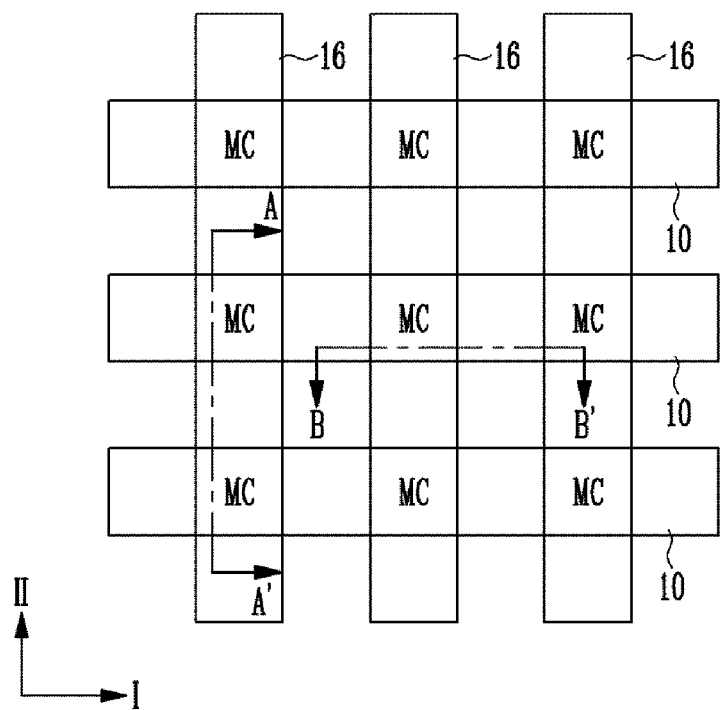
FIGS. 2A, 2B, and 2C are views illustrating a structure of an electronic device in accordance with an embodiment of the present disclosure.
Figure 2B:
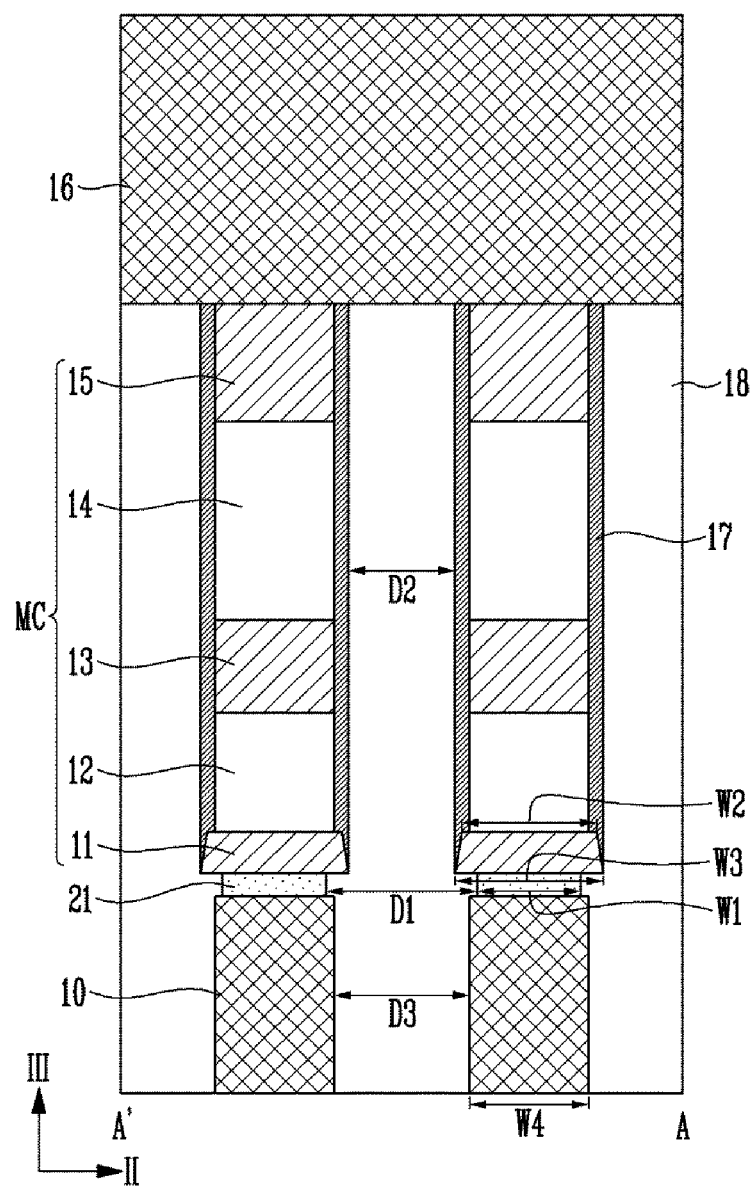
Figure 2C:
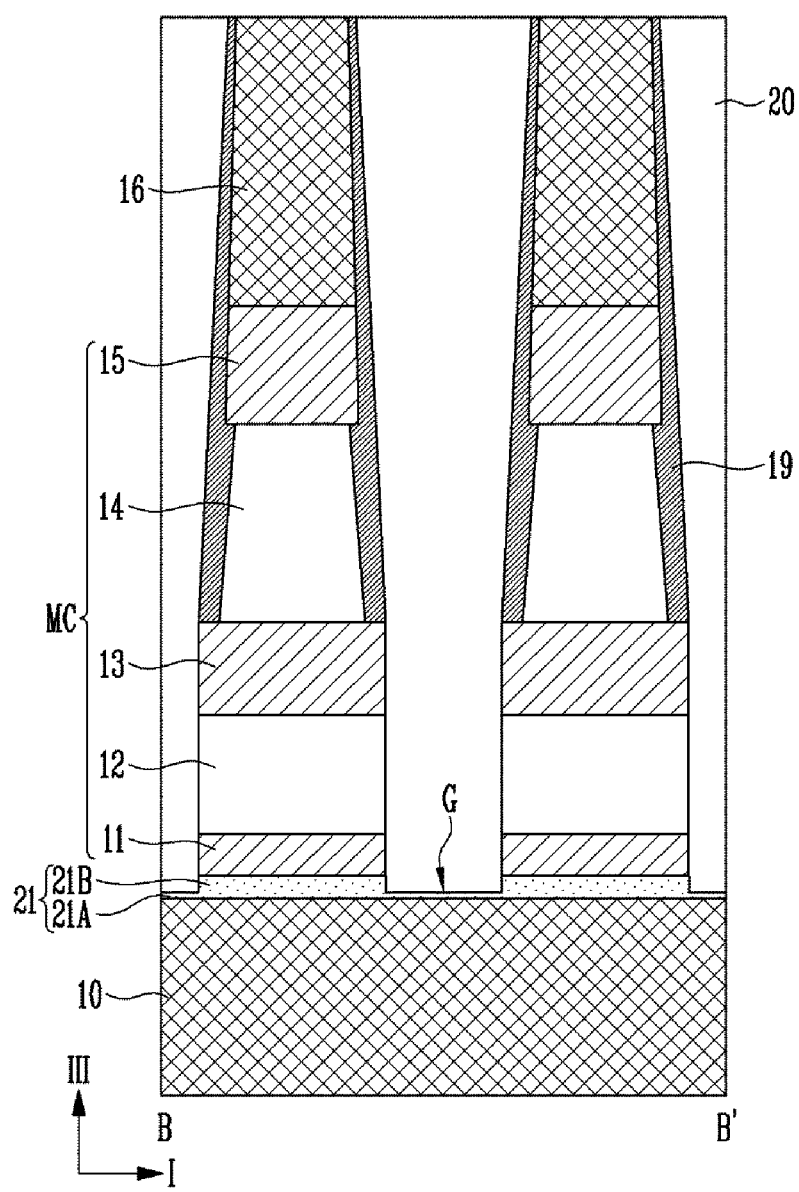

FIGS. 2A, 2B, and 2C are views illustrating a structure of an electronic device in accordance with an embodiment of the present disclosure. FIG. 2A is a layout, FIG. 2B is a cross-sectional view shown along a first line A-A' of FIG. 2A, and FIG. 2C is a cross-sectional view along a second line B-B' of FIG. 2A.

Referring to FIGS. 2A to 2C, the electronic device in accordance with the embodiment of the present disclosure may include row lines 10, column lines 16, interface layers 21, and memory cells MC. Also, the electronic device may further include a first protective layer 17, a second protective layer 19, a first insulating layer 18, and a second insulating layer 20. The memory cells MC may be respectively located in intersection regions of the row lines 10 and the column lines 16. In addition, the protective layers 17 and 19 may be formed on sidewalls of the memory cells MC, and the first insulating layer 18 and the second insulating layer 20 may be filled between the memory cells MC.

Each of the memory cells MC may include a lower electrode 11, a switching layer 12, an intermediate electrode 13, a variable resistance layer 14, and an upper electrode 15.

The variable resistance layer 14 may have a switching characteristic between different resistance states according to a voltage or current applied thereto. For example, when the variable resistance layer 14 has a first resistance state (e.g., a low resistance state), a first logic value (e.g., data '1') may be stored. When the variable resistance layer 14 has a second resistance state (e.g., a high resistance state), a second logic value (e.g., data '0') may be stored.

When the variable resistance layer 14 is made of a resistive material, the variable resistance layer 14 may include a transition metal oxide or include a metal oxide such as a perovskite-based material. Therefore, an electrical path may be generated or disappeared in the variable resistance layer 14, thereby storing data.

When the variable resistance layer 14 has an MTJ structure, the variable resistance layer 14 may include a magnetization fixed layer, a magnetization free layer, and a tunnel barrier layer interposed between the magnetization fixed layer and the magnetization free layer. For example, the magnetization fixed layer and the magnetization free layer may include a magnetic material, and the tunnel barrier layer may include an oxide such as magnesium (Mg), aluminum (Al), zinc (Zn), or titanium (Ti). The magnetization direction of the magnetization free layer may be changed by the spin torque of electrodes in a current applied to the magnetization free layer. Therefore, data may be stored based on a change in the magnetization direction of the magnetization free layer with respect to the magnetization direction of the magnetization fixed layer. When the variable resistance layer 14 is made of a phase change material, the variable resistance layer 14 may include a chalcogenide-based material. The variable resistance layer 14 may include, as the chalcogenide-based material, silicon (Si), germanium (Ge), antimony (Sb), tellurium (Te), bismuth (Bi), indium (In), tin (Sn), selenium (Se), or the like, or include any combination thereof. For example, the variable resistance layer 14 may be Ge—Sb—Te(GST), and be $Ge_2Sb_2Te_5$, $Ge_2Sb_2Te_7$, $Ge_1Sb_2Te_4$, $Ge_1Sb_4Te_7$ or the like. The chemical composition ratio of the variable resistance layer 14 may be determined by considering properties such as a melting point and a crystallization temperature. Also, the variable resistance layer 14 may further include an impurity such as carbon (C) or nitrogen (N). The phase change material has a low-resistance property in a crystalline state and has a high-resistance property in a non-crystalline state. Therefore, data may be stored by performing a set operation of switching the state of the phase change material from a high-resistance amorphous state to a low-resistance crystalline state and by performing a reset operation of switching the state of the phase change material from a low-resistance crystalline state to a high-resistance amorphous state.

The switching layer 12 may be a selection element that controls the flow of current according to the magnitude of a voltage or current applied thereto. When the magnitude of the applied voltage and current is a threshold value or less, current hardly flows in the switching layer 12. When the magnitude of the applied voltage and current exceeds the threshold value, an amount of current flowing in the switching layer 12 increases rapidly. The increased amount of current may be substantially in proportion to the magnitude of the applied voltage or current.

When the switching layer 12 is a Metal Insulator Transition (MIT) element, the switching layer 12 may include $VO_2$, $NbO_2$, $TiO_2$, $WO_2$, $TiO_2$, etc. When the switching layer 12 is a Mixed Ion-Electron Conducting (MIEC) element, the switching layer 12 may include $ZrO_2(Y_2O_3)$, $Bi_2O_3$—BaO, $(La_2O_3)_x(CeO_2)_{1-x}$, etc. Also, when the switching layer 12 is an Ovonic Threshold Switching (OST) element, the switching layer 12 may include a chalgonide-based material such as $As_2Te_3$, $As_2$, or $As_2Se_3$.

The lower electrode 11 may be electrically connected to the row line 10 through the interface layer 21. The intermediate electrode 13 may be interposed between the switching layer 12 and the variable resistance layer 14, and the upper electrode 15 may be electrically connected to the column line 16. The lower electrode 11, the intermediate electrode 13, and the upper electrode 15 may include a conductive material such as carbon, metal, metal nitride. For example, each of the lower electrode 11, the intermediate electrode 13, and the upper electrode 15 may include tungsten (W), tungsten nitride (WN), tungsten silicide (WSi), titanium (Ti), titanium nitride ($WN_x$), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), etc., or include any combination thereof.

Each of the lower electrode 11, the intermediate electrode 13, and the upper electrode 15 may have a single-layered or multi-layered structure. The lower electrode 11, the intermediate electrode 13, and the upper electrode 15 may have substantially the same thickness or have different thicknesses. In addition, the shape and configuration of the memory cells MC may vary according to embodiments. For example, one or more of the lower electrodes 11, the intermediate electrode 13, and the upper electrode 15 may be omitted.

The interface layers 21 are interposed between the row lines 10 and the lower electrodes 11. The interface layers 21 may each have a line shape extending in the first direction I. The interface layers 21 may be interposed between the row lines 10 and the lower electrodes 11 and between the row lines 10 and the second insulating layer 20. For example, referring to FIG. 2C, each of the interface layers 21 includes a first potion 21B interposed between the row line 10 and the lower electrode 11 and a second portion 21A interposed between the row line 10 and the second insulating layer 20. The interface layers 21 include a material having an etching rate higher than that of the row lines 10. For example, the interface layers 21 may include tungsten silicon nitride (WSiNx).

The first protective layer 17 and the second protective layer 19 are used to protect stacked layers in a fabricating process of the electronic device. The first protective layer 17 and the second protective layer 19 may be formed of a non-conductive material, and include oxide, nitride, poly-silicon, etc. For example, the first protective layer 17 and the second protective layer 19 may include silicon oxide ($SiO_x$), silicon nitride ($Si_3N_4$), poly-silicon, titanium nitride (TiN), tantalum nitride (TaN), etc., or include any combination thereof. Also, each of the first protective layer 17 and the second protective layer 19 may have a single-layered or a multi-layered structure.

The first protective layer 17 is formed to surround sidewalls of the memory cell MC, which face each other in the second direction II. The first protective layer 17 may extend in the first direction I. The second protective layer 19 may be formed to surround sidewalls of the memory cell MC, which face each other in the first direction I, and extend in the second direction II. The second protective layer 19 may be substantially entirely formed on the sidewalls of the memory cell MC or be partially formed on the sidewalls of the memory cell MC. Also, the second protective layer 19 may be formed on sidewalls of the column line 16. The second protective layer 19 may be formed on sidewalls of the column line 16, the upper electrode 15, and the variable resistance layer 14. When the second protective layer 19 is partially formed on the sidewalls of the memory cell MC, the second protective layer 19 may not be formed on sidewalls of the intermediate electrode 13, the switching layer 12, and the lower electrode 11 of the memory cell MC.

The first insulating layer 18 and the second insulating layer 20 may be formed between adjacent memory cells MC to fill a space between the adjacent memory cells MC. The first insulating layer 18 may fill a space between adjacent memory cells in the second direction II. The second insulating layer 20 may fill a space between adjacent memory cells MC in the first direction I. For example, the first insulating layer 18 and the second insulating layer 20 may include an oxide such as silicon oxide ($SiO_2$), include a flowable oxide layer such as a Spin On Coating (SOC) layer or a Spin On Dielectric (SOD) layer, or include any combination thereof.

In accordance with the structure described above, the memory cells MC are arranged in a cross-point structure, so that the degree of integration of memory elements can be increased.

Meanwhile, the column lines 16, the memory cells MC, the interface layers 21, and the row lines 10 may each have cross-sections having different shapes when seen in the first direction I and the second direction II.

Upper and lower surfaces of the variable resistance layer 14 may have substantially the same width in a cross-sectional view of FIG. 2B. In this instance, the term "substantially the same" may signify that two values are included in a range, and the range covers differences of the two values caused by a limitation of a manufacturing process. The lower surface of the variable resistance layer 14 may have a width wider than that of the upper surface of the variable resistance layer 14 in a cross-sectional view of FIG. 2C. Upper and lower surfaces of the intermediate electrode 13 may have substantially the same width. For example, the upper surface of the intermediate electrode 13 may have substantially the same width as the lower surface of the variable resistance layer 14 in a cross-sectional view of FIG. 2B. The upper surface of the intermediate electrode 13 may have a width wider than that of the lower surface of the variable resistance layer 14 in a cross-sectional view of FIG. 2C. Upper and lower surfaces of the switching layer 12 may substantially have the same width. The upper surface of the switching layer 12 and the lower surface of the intermediate electrode 12 may substantially have the same width.

Referring to FIG. 2B, a lower surface of the lower electrode 11 may have a width W3 wider than that W2 of an upper surface of the lower electrode 11. The upper surface of the lower electrode 11 and the lower surface of the switching layer 12 may substantially have the same width, or the upper surface of the lower electrode 11 may have a width wider than that of the lower surface of the switching layer 12.

Upper and lower surfaces of the interface layer 21 may substantially have the same width W1. The interface layer 21 may have a width narrower than that of the lower electrode 11. For example, the interface layer 21 may have a width W1 narrower than that W3 of the lower surface of the lower electrode 11, or have the width W1 narrower than that W2 of the upper surface of the lower electrode 11.

Upper and lower surfaces of each of the row lines 10 may substantially have the same width W4. The interface layer 21 may have a width W1 narrower than that W4 of the row line 10. The interface layer 21 may have a width narrower than that of the upper surface of the row line 10, or have a width narrower than that of the lower surface of the row line 10, or both.

According to the structure described above, in the second direction II, the interface layer 21 has a width narrower than that (e.g., the width W3 in FIG. 2B) of the memory cell MC, or has a width narrower than that of the row line 10, or has a width narrower than those of the memory cell MC and the row line 10. Thus, a distance D1 between adjacent interface layers 21 in the second direction II is wider than that D2 between adjacent memory cells MC in the second direction II, or is wider than that D3 between adjacent row lines 10 in the second direction II, or both. Accordingly, a space margin can be secured, and a bridge between adjacent row lines can be improved.

Further, the interface layer 21 is added, so that a reset current can be decreased and a threshold voltage window can be increased. In addition, the interface layer 21 increases a total electrical resistance between the column line 16 and the row line 10 during a read operation of the memory cell MC, thereby decreasing a magnitude of a current flowing through the memory cell MC during the read operation. An amount of heat generated in the memory cell MC during the read operation may be reduced and thus, read disturbance can be substantially prevented.

Figure 3A:
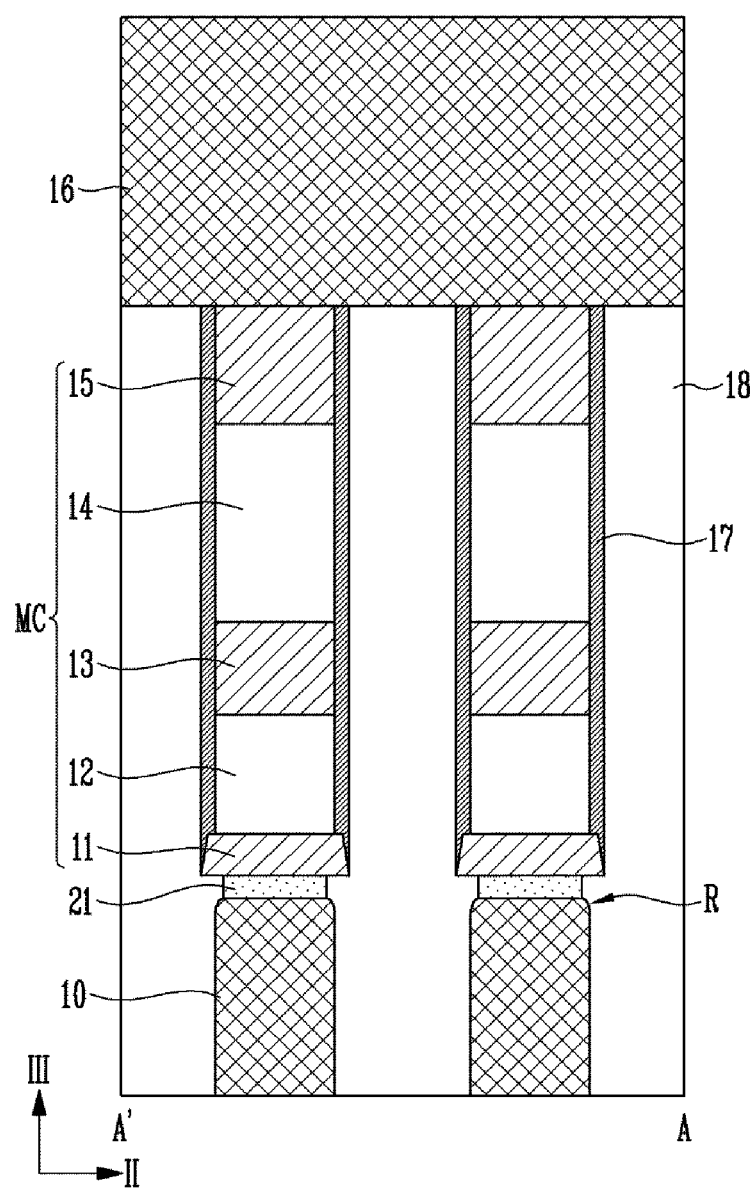
FIGS. 3A and 3B are views illustrating a structure of an electronic device in accordance with an embodiment of the present disclosure.
Figure 3B:
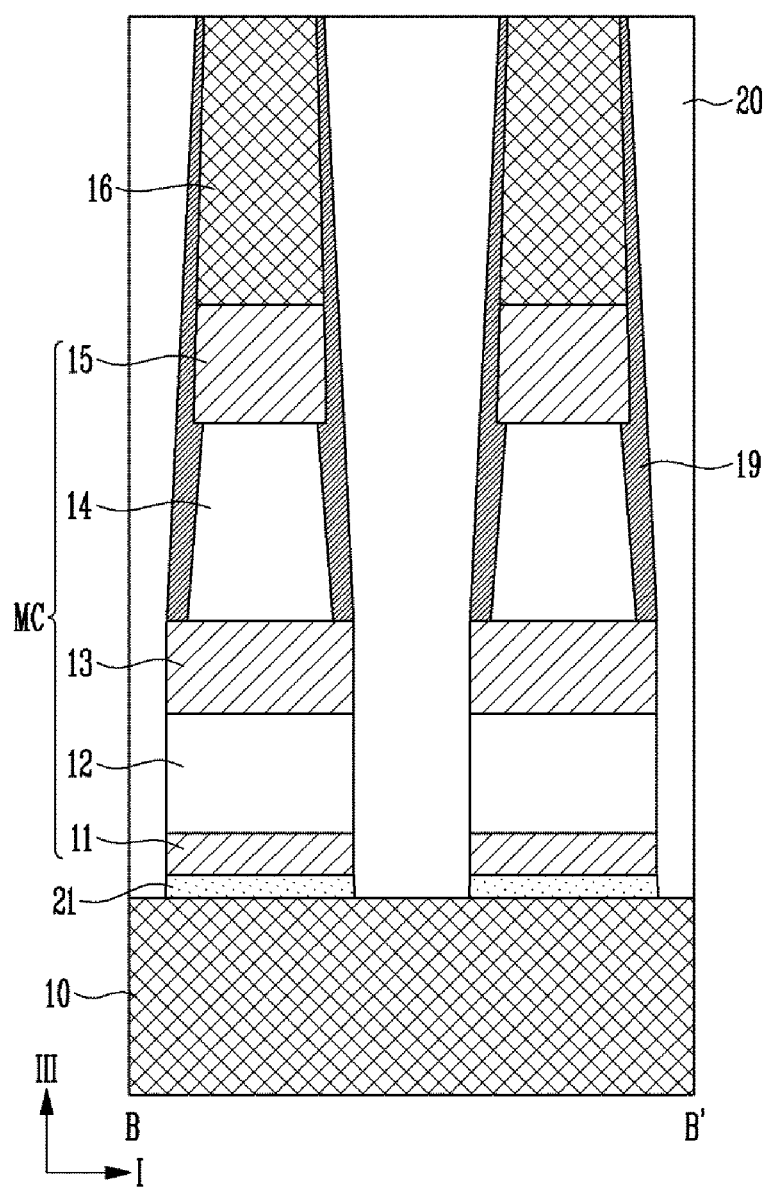

FIGS. 3A and 3B are views illustrating a structure of an electronic device in accordance with an embodiment of the present disclosure. FIG. 3A may be a cross-sectional view along the first line A-A' in FIG. 2A, and FIG. 3B may be a cross-sectional view along the second line B-B' in FIG. 2A in the first direction I. Hereinafter, descriptions of contents overlapping with those described above with reference to FIGS. 2B and 2C will be omitted.

Referring to FIGS. 3A and 3B, the upper surfaces of the row lines 10 may have a shape R having a rounded edge. A width of an upper portion (or a curved portion) of the row line 10 in the second direction II at a level from the lower surface of the row line 10 gradually decreases as the level increases in the third direction III. The interface layers 21 may be located in the intersection regions of the row lines 10 and the column lines 16. The interface layers 21 may be arranged in the first direction I and the second direction II, and each have an island shape. Also, the interface layers 21 may be interposed between the row lines 10 and the lower electrodes 11. Specifically, the embodiment shown in FIG. 3B differs from that in FIG. 2C in that each of the interface layers 21 in FIG. 3B may not include the second portion 21A in FIG. 2C disposed between the row line 10 and the second insulating layer 20. As a result, adjacent interface layers 21 in FIG. 3B are spaced apart from each other in the first direction I as well as the second direction II.

Figure 4A:
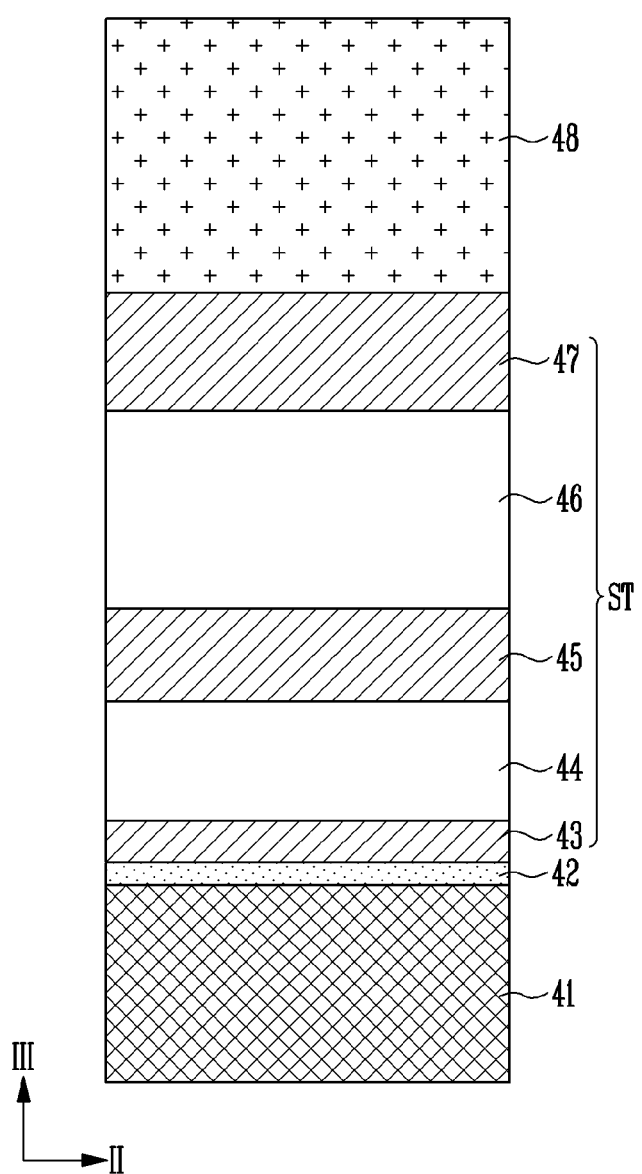
FIGS. 4A, 4B, 4C, 4D, 4E, 4F, and 4G are views illustrating a method for fabricating an electronic device including a semiconductor memory in accordance with an embodiment of the present disclosure.
Figure 4B:
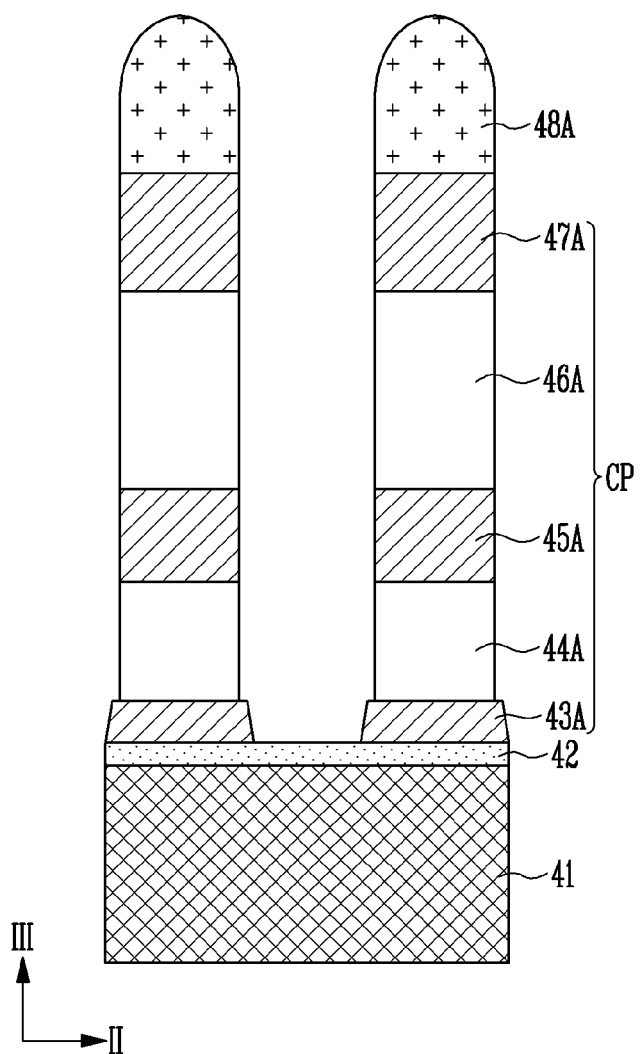
Figure 4C:
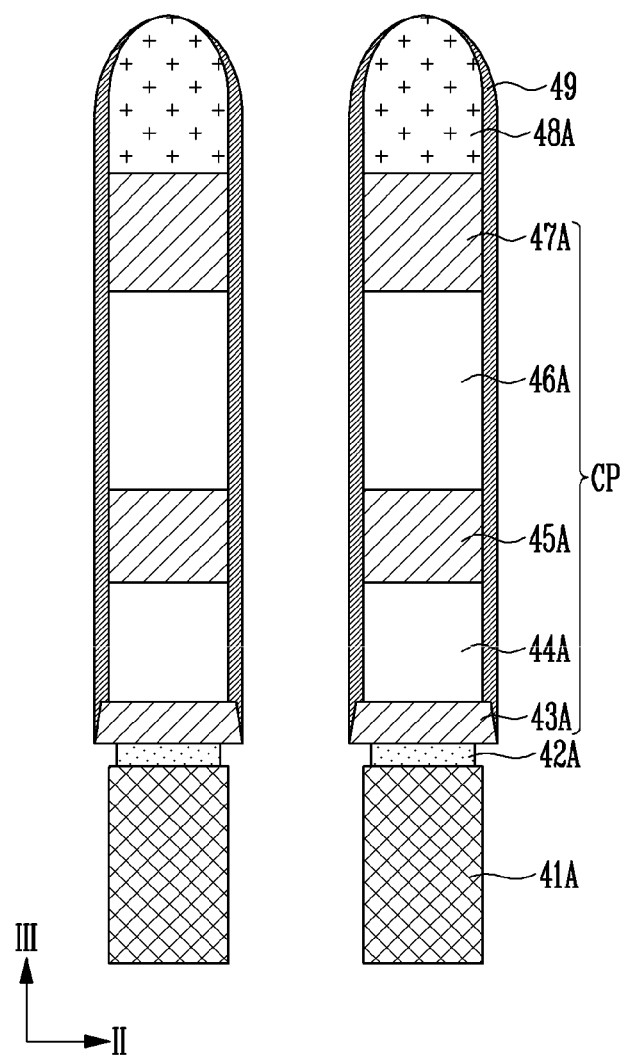

FIGS. 4A to 4G are views illustrating a method for fabricating an electronic device including a semiconductor memory in accordance with an embodiment of the present disclosure. FIGS. 4A to 4C may be cross-sectional views corresponding to that along the first line A-A' in FIG. 2A, and FIGS. 4D to 4G may be cross-sectional views corresponding to that along the second line B-B' in FIG. 2A. Hereinafter, descriptions of contents overlapping with those described above will be omitted.

Referring to FIG. 4A, a first conductive layer 41 for forming row lines is formed on a base (not shown). The base may be a semiconductor substrate, and include a lower structure formed on the semiconductor substrate. For example, the base may include a circuit formed on the semiconductor substrate, or include a line, an interconnection such as a contact plug, an interlayer insulating layer, and the like.

Subsequently, a second conductive layer 42 for forming interface layers is formed on the conductive layer 41. The second conductive layer 42 may be formed of a material having an etching rate higher than that of the first conductive layer 41. The first conductive layer 41 may be a tungsten layer, and the second conductive layer 42 may be a tungsten silicon nitride layer.

Subsequently, a cell stack structure ST including a lower electrode material layer 43 and an upper electrode material layer 47 is formed on the conductive layer 42. The cell stack structure ST may include the lower electrode material layer 43, a switching material layer 44, an intermediate electrode material layer 45, a variable resistance material layer 46, and the upper electrode material layer 47.

Subsequently, a hard mask 48 is formed on the cell stack structure ST. The hard mask 48 may have a single layered or multi-layered structure. The hard mask 48 may include a poly-silicon layer, an oxide layer, etc.

Referring to FIG. 4B, a hard mask pattern 48A is formed by etching the hard mask 48. Subsequently, the cell stack structure ST is etched using the hard mask pattern 48 as an etch barrier. An upper electrode pattern layer 47A, a variable resistance pattern layer 46A, an intermediate electrode pattern layer 45A, a switching pattern layer 44A, and a lower electrode pattern layer 43A, which extend in the first direction I, may be formed by etching the upper electrode material layer 47, the variable resistance material layer 46, the intermediate electrode material layer 45, the switching material layer 44, and the lower electrode material layer 43. Accordingly, cell patterns CP extending in the first direction I are formed.

Upper and lower surfaces of the variable resistance pattern layer 46A may have substantially the same width. The upper surface of the variable resistance pattern layer 46A and a lower surface of the upper electrode pattern layer 47A may have substantially the same width, or the upper surface of the variable resistance pattern layer 46A may have a width narrower than that of the lower surface of the upper electrode pattern layer 47A. In addition, the variable resistance pattern layer 46A and the upper electrode pattern layer 47A may have sidewalls having slopes substantially equal to or different from each other. A difference in widths between the variable resistance pattern layer 46A and the upper electrode pattern layer 47A and a difference in sidewall slopes between the variable resistance pattern layer 46A and the upper electrode pattern layer 47A may be caused by a difference in etching rates between the variable resistance material layer 46 and the upper electrode material layer 47.

Upper and lower surfaces of the intermediate electrode pattern layer 45A may have substantially the same width. Upper and lower surfaces of the switching pattern layer 44A may have substantially the same width. The upper surface of the switching pattern layer 44A and the lower surface of the intermediate electrode pattern layer 45A may have substantially the same width.

A lower surface of the lower electrode pattern layer 43A may have a width wider than that of an upper surface of the lower electrode pattern layer 43A. The upper surface of the lower electrode pattern layer 43A and the lower surface of the switching pattern layer 44A may substantially have the same width, or the upper surface of the lower electrode pattern layer 43A may have a width wider than that of the lower surface of the switching pattern layer 44A. A difference in widths between the lower electrode pattern layer 43A and the switching pattern layer 44A may be caused by a difference in etching rates between the lower electrode material layer 43 and the switching material layer 44.

Referring to FIG. 4C, a first protective layer 49 is formed on sidewalls of the cell patterns CP. The first protective layer 49 may be formed on sidewalls of the lower electrode pattern layer 43A, the switching pattern layer 44A, the intermediate electrode pattern layer 45A, the variable resistance pattern layer 46A, and the upper electrode pattern layer 47A. Subsequently, the second conductive layer 42 and the first conductive layer 41 are etched using the hard mask pattern 48A and the first protective layer 49 as an etch barrier. Accordingly, interface layers 42A and row lines 41A, which extend in the first direction I, are formed.

Upper and lower surfaces of the interface layers 42A may have substantially the same width. Upper and lower surfaces of the row lines 41A may have substantially the same width. In addition, each of the interface layers 42A may have a width narrower than that of each of the row lines 41A.

A difference in width between the interface layers 42A and the row lines 41A may be caused by a difference in etching rates between materials of the interface layers 42A and the row lines 41A. The interface layers 42A is formed of a material having an etching rate higher than that of the material of the row lines 41A, so that the interface layers 42A having a width narrower than that of the row lines 41A can be formed. For example, the row lines 41A may be a tungsten layer, and the interface layers 42A may be a tungsten silicon nitride layer (WSiNx). Since the tungsten silicon nitride layer has an etching rate higher than that of the tungsten layer, an etching speed of the interface layers 42A is faster than that of the row lines 41A. Thus, an etching amount of the interface layers 42A is greater than that of the row lines 41A, and the interface layers 42A have a width narrower than that of the row lines 41A.

Figure 4D:
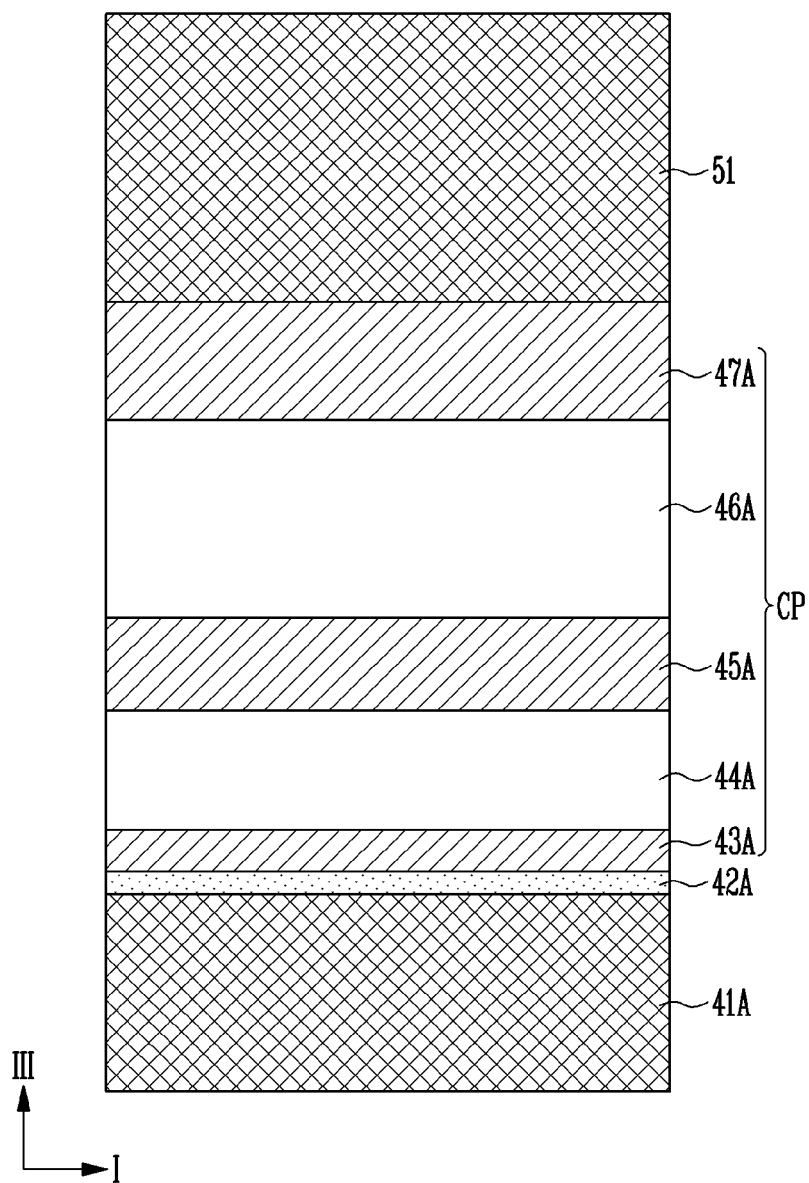

Hereinafter, the method for fabricating the electronic device will be described with reference to FIGS. 4D to 4G, which are cross-sectional views corresponding to that along the second line B-B' in FIG. 2A. Referring to FIG. 4D, after an insulating layer (not shown) is formed between adjacent cell patterns CP in the second direction II, the insulating layer is planarized until an upper surface of the upper electrode pattern layer 47A is exposed. For example, the insulating layer is polished using a Chemical Mechanical Polishing (CMP) process. Subsequently, a third conductive layer 51 for column lines is formed. The third conductive layer 51 may be a tungsten layer.

Figure 4E:
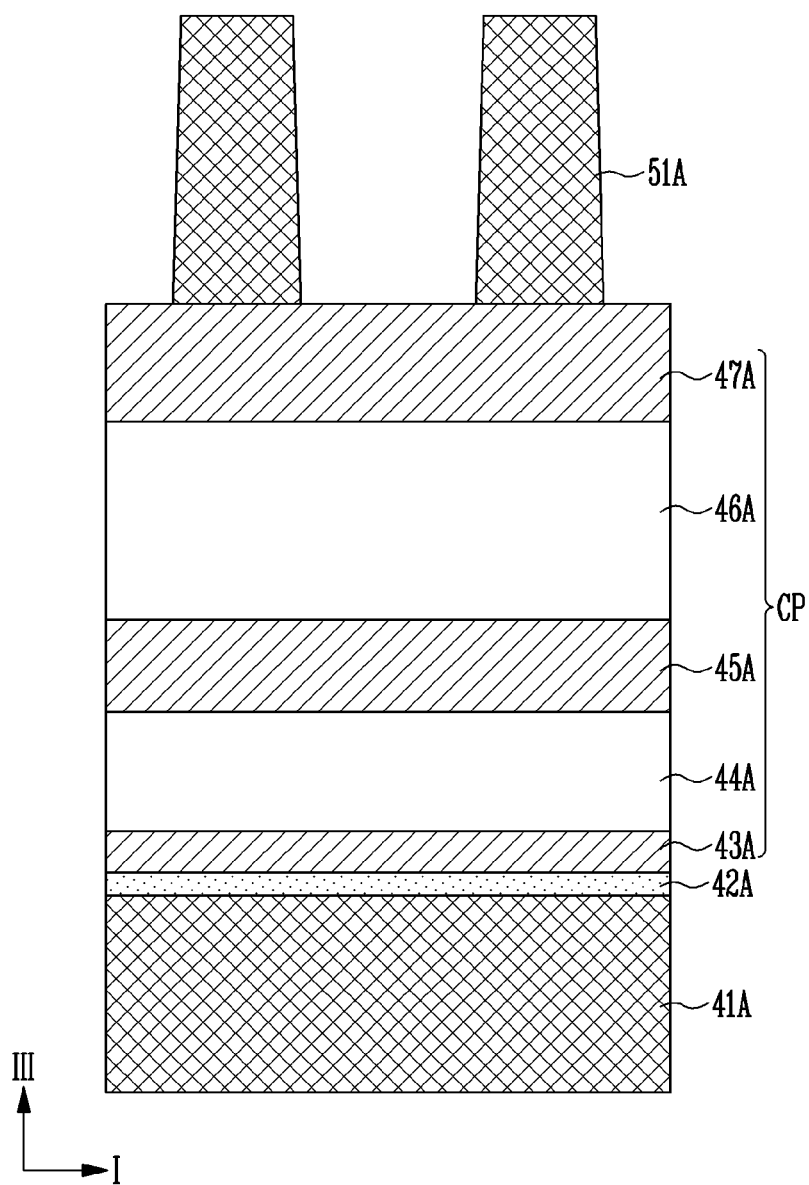

Referring to FIG. 4E, column lines 51A each extending in the second direction II are formed by etching the third conductive layer 51.

Figure 4F:
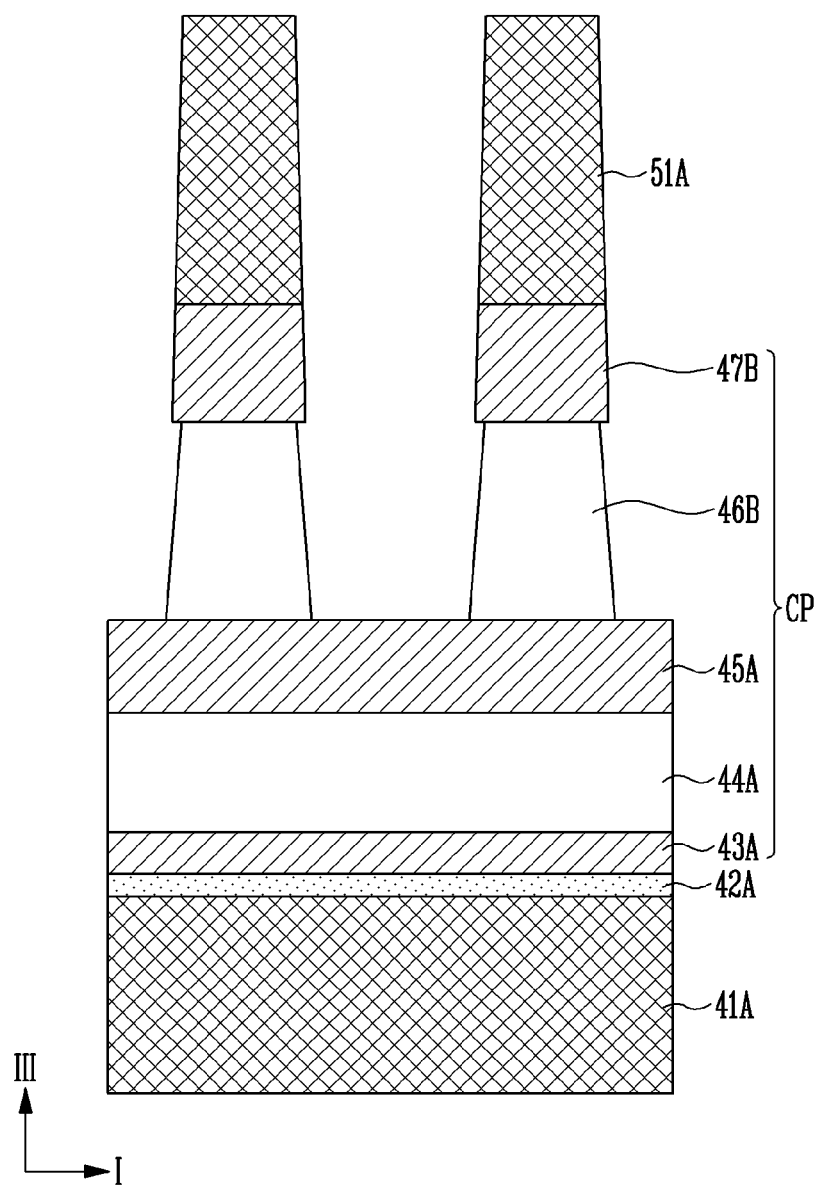

Referring to FIG. 4F, an upper electrode 47B and a variable resistance layer 46B are formed by etching the upper electrode pattern layer 47A and the variable resistance pattern layer 46A. A lower surface of the upper electrode 47B may have a width wider than that of an upper surface of the upper electrode 47B, or the upper and lower surfaces of the upper electrode 47B may have substantially the same width.

Figure 4G:
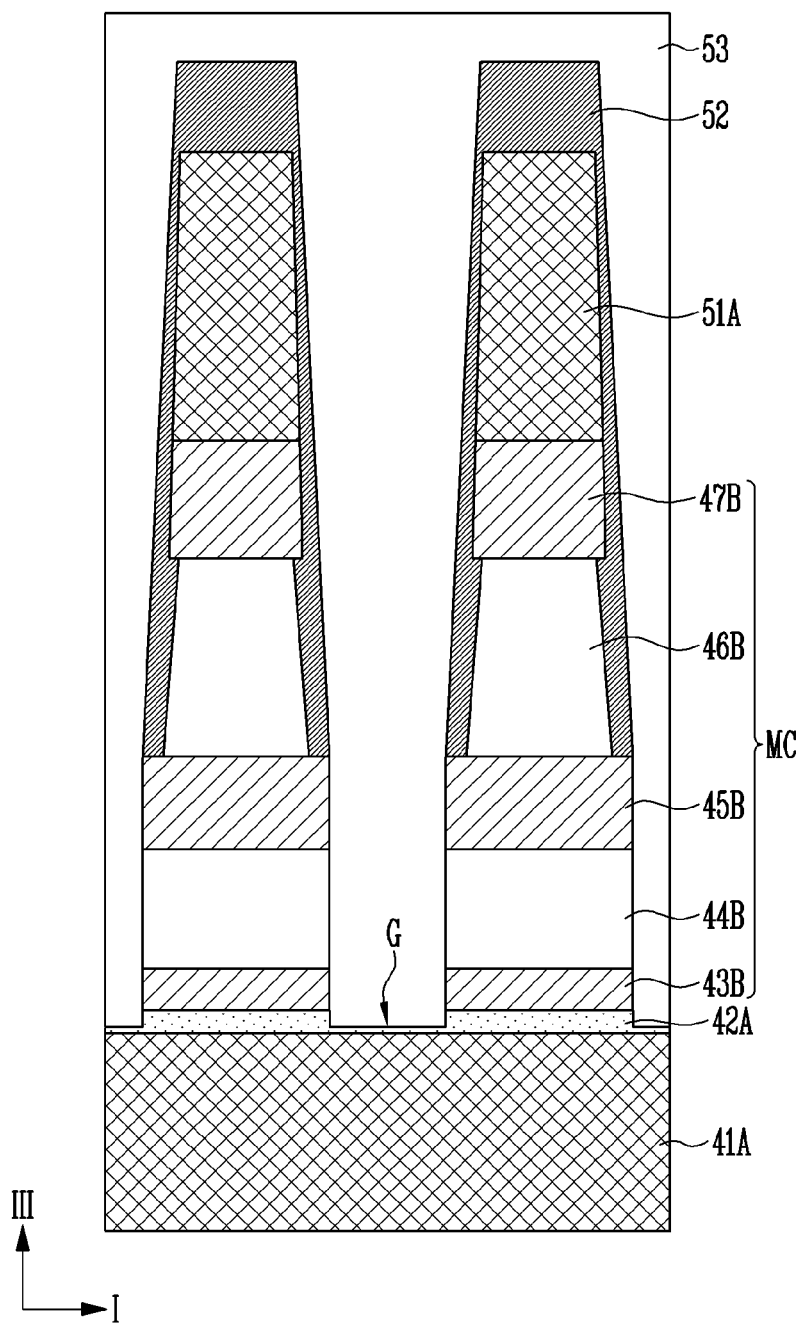

Referring to FIG. 4G, a second protective layer 52 is formed on the variable resistance layer 46B, the upper electrode 47B, and the column line 51A. Subsequently, the intermediate electrode pattern layer 45A, the switching pattern layer 44A, and the lower electrode pattern layer 43A are etched using the second protective layer 52 as an etch barrier. Accordingly, memory cells MC including a lower electrode 43B, a switching layer 44B, an intermediate electrode 45B, the variable resistance layer 46B, and the upper electrode 47B are formed. The memory cells MC are respectively located in intersection regions of the row lines 41A and the column line 51A.

When the lower electrode pattern layer 43A is etched, the interface layer 42A may be partially etched to have a given thickness. A groove G may be formed at an upper surface of the interface layer 42A. The groove G is located between adjacent memory cells MC in the first direction I. In addition, the interface layer 42A has a line shape extending in the first direction I. For example, the interface layer 42A may have a first portion (e.g., the first portion 21B in FIG. 2C) disposed between the row line 41A and the lower electrode 43B and a second portion (e.g., the second portion 21A in FIG. 2C) disposed between the row line 41A and the insulating layer 53).

Alternatively, although not shown in FIG. 4G, when the lower electrode 43A is etched, the interface layer 42A may be etched, and the row line 41A may be exposed. The interface layers 42A are respectively located in intersection regions of the row lines 41A and the column line 51A. Also, the interface layers 42A may be located corresponding to the respective memory cells MC, and each have an island shape. For example, adjacent interface layers 42A may be are spaced apart from each other in the first direction I as well as the second direction II.

Subsequently, an insulating layer 53 may be formed to fill a space between adjacent memory cells MC.

In the method described above according to an embodiment of the present disclosure, the second conductive layer 42 having a relatively high etching rate is formed between the lower electrode material layer 43 and the first conductive layer 41, so that the interface layer 42A having a relatively narrow width can be formed. Thus, the distance between adjacent interface layers 42A in the second direction II can be increased compared to a distance between adjacent row lines in a conventional memory device. Accordingly, gap fill characteristics of the insulating layer 53 can be enhanced, and an occurrence of a bridge between adjacent row lines 41A can be reduced.

Figure 5:
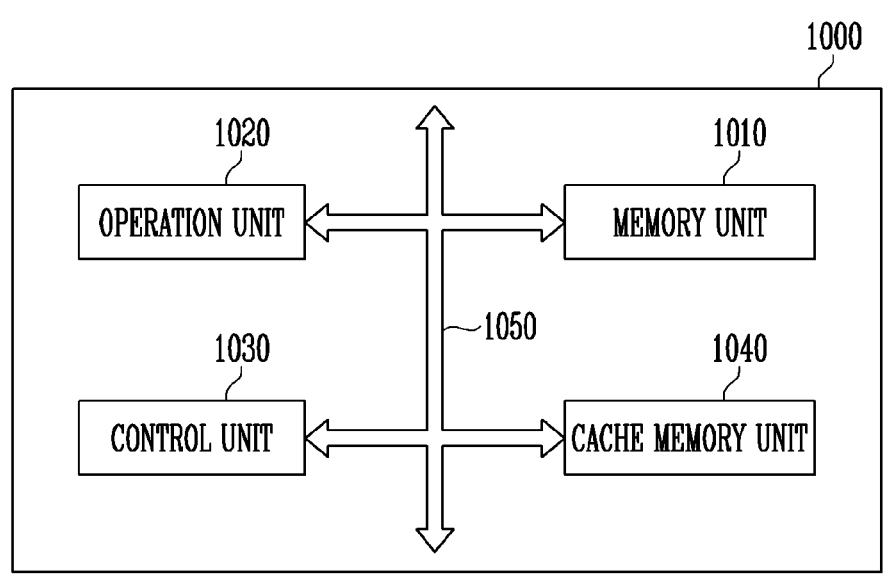
FIG. 5 is a configuration view of a microprocessor implementing a memory device in accordance with an embodiment of the present disclosure.

FIG. 5 is a configuration view of a microprocessor implementing a memory device in accordance with an embodiment of the present disclosure.

Referring to FIG. 5, the microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and the like. The microprocessor 1000 may be various data processing units such as a central processing unit (CPU), a graphic processing unit (GPU), a digital signal processor (DSP), and an application processor (AP).

The memory unit 1010 is a part which stores data in the microprocessor 1000, as a processor register, register or the like. The memory unit 1010 may include a data register, an address register, a floating point register, and the like. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the embodiments. For example, the memory unit 1010 may include: row lines; column lines intersecting the row lines; memory cells located in intersection regions of the row lines and the column lines, the memory cells including upper and lower electrodes; and interface layers located between the lower electrodes of the memory cells and the row lines, the interface layers having a width narrower than that of the row lines. Accordingly, read operation characteristics of the memory unit 1010 can be improved. Consequently, read operation characteristics of the microprocessor 1000 can be improved.

The operation unit 1020 may perform several arithmetical operations or logical operations according to results that the control unit 1030 decodes commands. The operation unit 1020 may include at least one arithmetic logic unit (ALU) and the like.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 in accordance with this embodiment may additionally include a cache memory unit 1040 which can temporarily store data to be inputted from an external device other than the memory unit 1010 or to be outputted to an external device. The cache memory unit 1040 may exchange data with the memory unit 1010, the operation unit 1020 and the control unit 1030 through a bus interface 1050.

Figure 6:
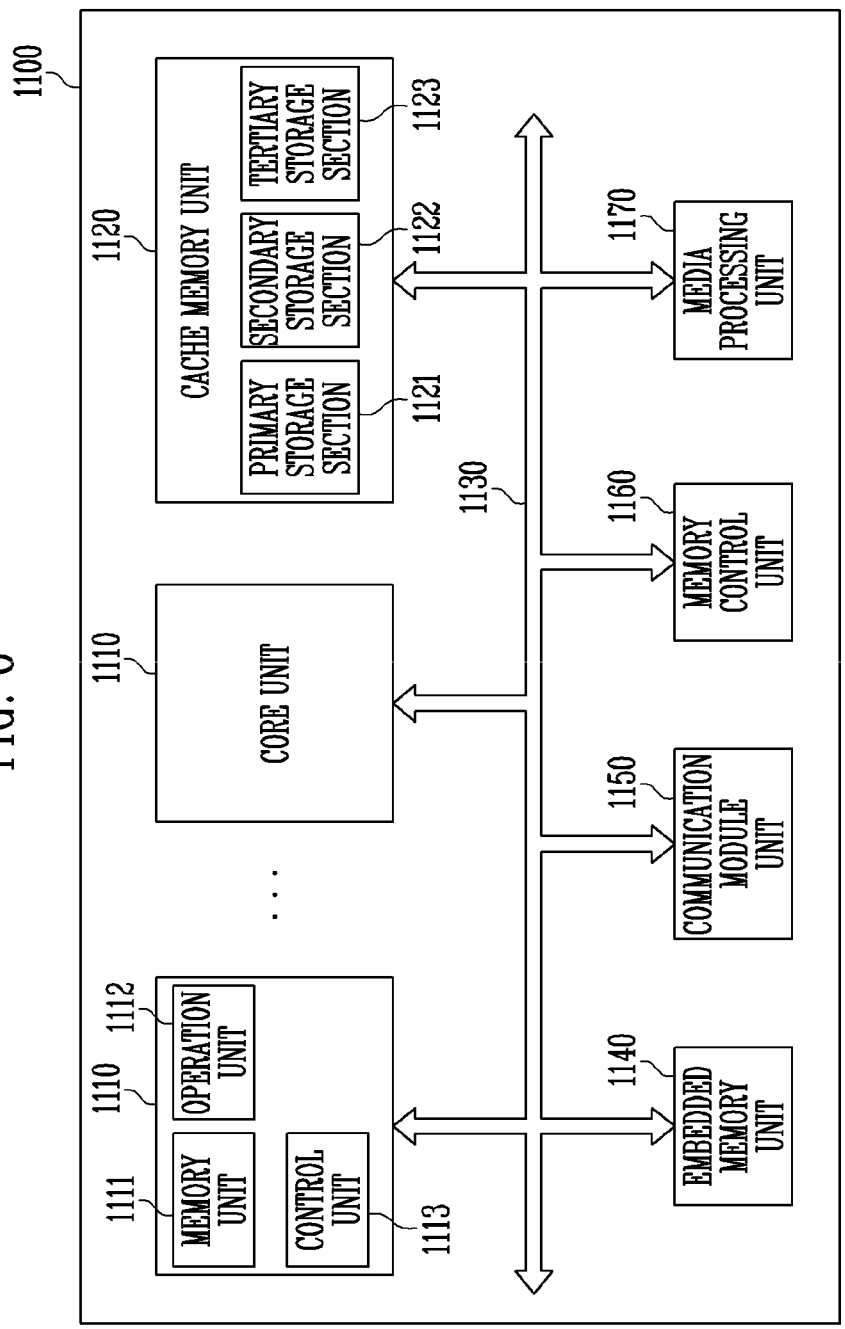
FIG. 6 is a configuration view of a processor implementing a memory device in accordance with an embodiment of the present disclosure.

FIG. 6 is a configuration view of a processor implementing a memory device in accordance with an embodiment of the present disclosure.

Referring to FIG. 6, the processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU), and an application processor (AP).

The core unit 1110 of this embodiment is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register, and the like. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform several arithmetical operations, logical operations, according to results that the control unit 1113 decodes commands, or the like. The operation unit 1112 may include at least one arithmetic logic unit (ALU) and the like. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments.

For example, the cache memory unit 1120 may include: row lines; column lines intersecting the row lines; memory cells located in intersection regions of the row lines and the column lines, the memory cells including upper and lower electrodes; and interface layers located between the lower electrodes of the memory cells and the row lines, the interface layers having a width narrower than that of the row lines. Accordingly, read operation characteristics of the cache memory unit 1120 can be improved. Consequently, read operation characteristics of the processor 1100 can be improved.

Although a case where all the primary, secondary and tertiary storage sections 1121, 1122 and 1123 are configured inside the cache memory unit 1120 is illustrated in FIG. 6, all the primary, secondary and tertiary storage sections 1121, 1122 and 1123 of the cache memory unit 1120 may be configured outside the core unit 1110 and may compensate for a difference in data processing speed between the core unit 1110 and the external device. Alternatively, the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. Alternatively, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 in accordance with this embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another embodiment, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 in accordance with this embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device, and the like. Besides, the processor 1100 may include a plurality of various modules and devices. The plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and the like. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and the like.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and the like.

Figure 7:
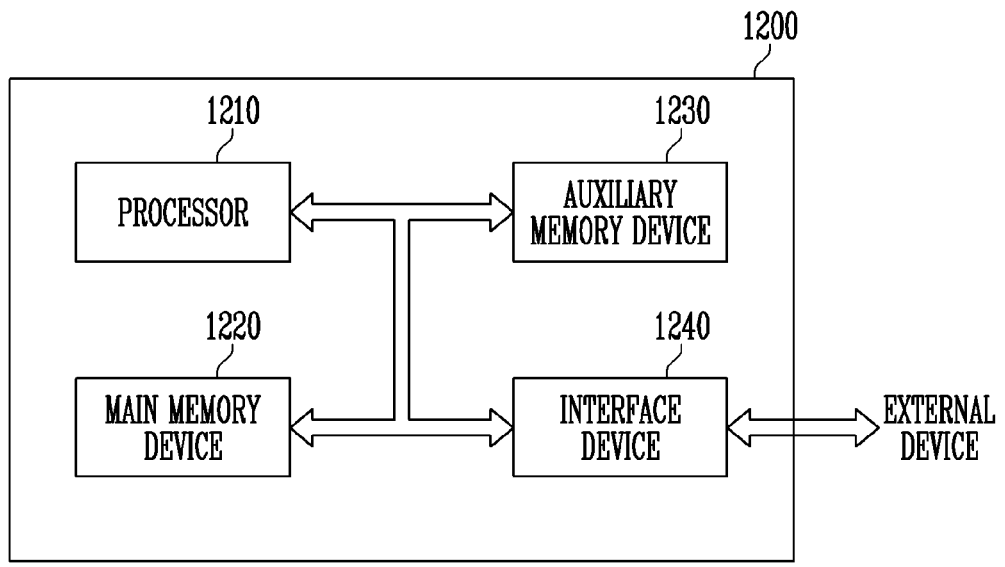
FIG. 7 is a configuration view of a system implementing a memory device in accordance with an embodiment of the present disclosure.

FIG. 7 is a configuration view of a system implementing a memory device in accordance with an embodiment of the present disclosure.

Referring to FIG. 7, the system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and the like. The system 1200 of this embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and the like.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and the like.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the embodiments. For example, the main memory device 1220 may include: row lines; column lines intersecting the row lines; memory cells located in intersection regions of the row lines and the column lines, the memory cells including upper and lower electrodes; and interface layers located between the lower electrodes of the memory cells and the row lines, the interface layers having a width narrower than that of the row lines. Accordingly, read operation characteristics of the main memory device 1220 can be improved. Consequently, read operation characteristics of the system 1200 can be improved.

Also, the main memory device 1220 may further include a static random access memory (SRAM), a dynamic random access memory (DRAM), and the like, of a volatile memory type in which all contents are erased when power supply is cut off. Unlike this, the main memory device 1220 may not include the semiconductor devices in accordance with the embodiments, but may include a static random access memory (SRAM), a dynamic random access memory (DRAM), and the like, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the embodiments. For example, the auxiliary memory device 1230 may include: row lines; column lines intersecting the row lines; memory cells located in intersection regions of the row lines and the column lines, the memory cells including upper and lower electrodes; and interface layers located between the lower electrodes of the memory cells and the row lines, the interface layers having a width narrower than that of the row lines. Accordingly, read operation characteristics of the auxiliary memory device 1230 can be improved. Consequently, read operation characteristics of the system 1200 can be improved.

Also, the auxiliary memory device 1230 may further include a data storage system (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like. Unlike this, the auxiliary memory device 1230 may not include the semiconductor devices in accordance with the embodiments, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The interface device 1240 may be to perform exchange of commands and data between the system 1200 of this embodiment and an external device. The interface device 1240 may be a keypad, a keyboard, a mouse, a speaker, a mike, a display, various human interface devices (HIDs), a communication device, and the like. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and the like.

Figure 8:
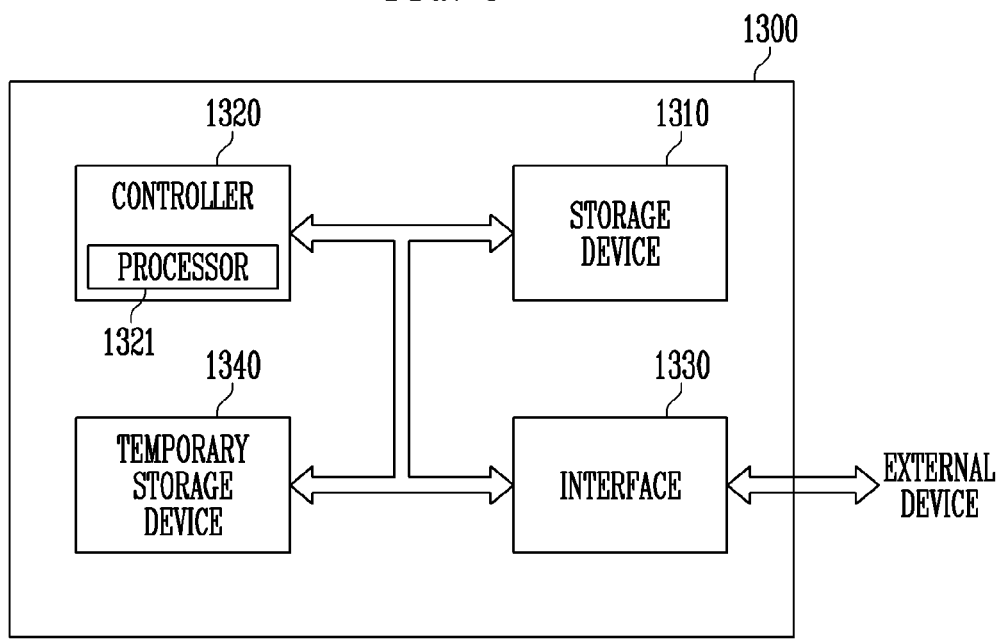
FIG. 8 is a configuration view of a data storage system implementing a memory device in accordance with an embodiment of the present disclosure.

FIG. 8 is a configuration view of a data storage system implementing a memory device in accordance with an embodiment of the present disclosure.

Referring to FIG. 8, the data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and the like, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and the like.

The controller 1320 may control exchange of data between the storage device 1310 and the interface 1330. To this end, the controller 1320 may include a processor 1321 for performing an operation for, processing commands inputted through the interface 1330 from an outside of the data storage system 1300, and the like.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and the like, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the embodiments. For example, the temporary storage device 1340 may include: row lines; column lines intersecting the row lines; memory cells located in intersection regions of the row lines and the column lines, the memory cells including upper and lower electrodes; and interface layers located between the lower electrodes of the memory cells and the row lines, the interface layers having a width narrower than that of the row lines. Accordingly, read operation characteristics of the temporary storage device 1340 can be improved. Consequently, read operation characteristics of the data storage system 1300 can be improved.

Figure 9:
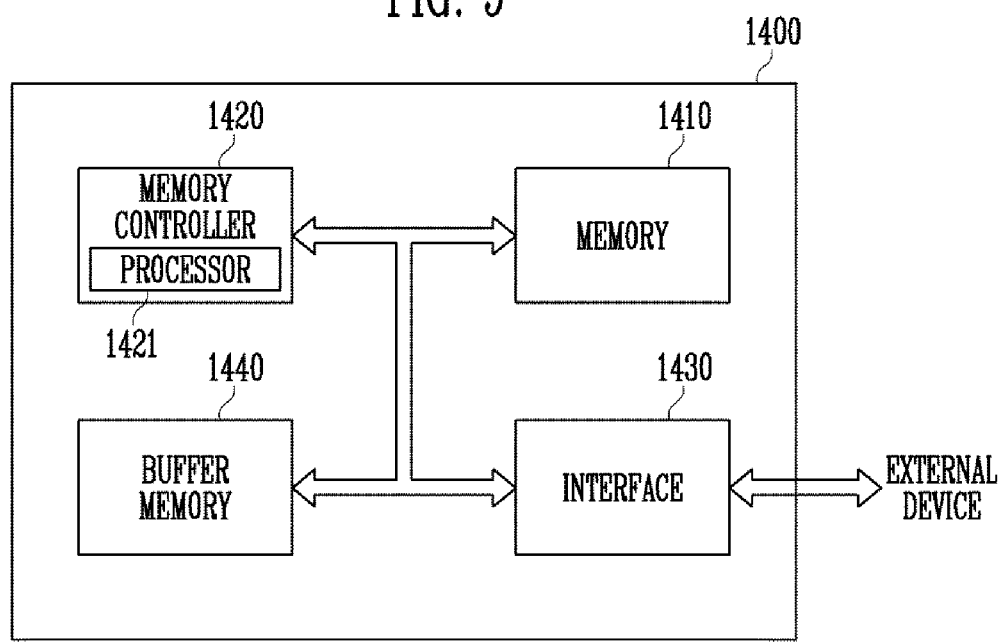
FIG. 9 is a configuration view of a memory system implementing a memory device in accordance with an embodiment of the present disclosure.

FIG. 9 is a configuration view of a memory system implementing a memory device in accordance with an embodiment of the present disclosure.

Referring to FIG. 9, the memory system 1400 may include a memory 1410 which has a nonvolatile characteristic as a component for storing data, a memory controller 1420 which controls the memory 1410, an interface 1430 for connection with an external device, and the like. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The memory 1410 for storing data may include one or more of the above-described semiconductor devices in accordance with the embodiments. For example, the memory 1410 may include: row lines; column lines intersecting the row lines; memory cells located in intersection regions of the row lines and the column lines, the memory cells including upper and lower electrodes; and interface layers located between the lower electrodes of the memory cells and the row lines, the interface layers having a width narrower than that of the row lines. Accordingly, read operation characteristics of the memory 1410 can be improved. Consequently, read operation characteristics of the memory system 1400 can be improved.

Also, the memory 1410 of this embodiment may further include a ROM (read only memory), a NOR flash memory, a NAND flash memory, a phase change random access memory (PRAM), a resistive random access memory (RRAM), a magnetic random access memory (MRAM), and the like, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like, or be compatible with interfaces which are used in devices similar to the above mentioned devices. The interface 1430 may be compatible with one or more interfaces having a different type from each other.

The memory system 1400 of this embodiment may further include a buffer memory 1440 for efficiently transferring data between the interface 1430 and the memory 1410 according to diversification and high performance of an interface with an external device, a memory controller and a memory system. The buffer memory 1440 for temporarily storing data may include one or more of the above-described semiconductor devices in accordance with the embodiments. For example, the buffer memory 1440 may include: row lines; column lines intersecting the row lines; memory cells located in intersection regions of the row lines and the column lines, the memory cells including upper and lower electrodes; and interface layers located between the lower electrodes of the memory cells and the row lines, the interface layers having a width narrower than that of the row lines. Accordingly, read operation characteristics of the buffer memory 1440 can be improved. Consequently, read operation characteristics of the memory system 1400 can be improved.

Moreover, the buffer memory 1440 of this embodiment may further include an SRAM (static random access memory), a DRAM (dynamic random access memory), and the like, which have a volatile characteristic, and a phase change random access memory (PRAM), a resistive random access memory (RRAM), a spin transfer torque random access memory (STTRAM), a magnetic random access memory (MRAM), and the like, which have a nonvolatile characteristic. Unlike this, the buffer memory 1440 may not include the semiconductor devices in accordance with the embodiments, but may include an SRAM (static random access memory), a DRAM (dynamic random access memory), and the like, which have a volatile characteristic, and a phase change random access memory (PRAM), a resistive random access memory (RRAM), a spin transfer torque random access memory (STTRAM), a magnetic random access memory (MRAM), and the like, which have a nonvolatile characteristic.

In the electronic device and the method for fabricating the same in accordance with the present disclosure, the operational characteristics and reliability of memory cells can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. An electronic device comprising a semiconductor memory, wherein the semiconductor memory includes:
a plurality of row lines;
a plurality of column lines intersecting the row lines;
a plurality of memory cells located in a plurality of intersection regions of the row lines and the column lines, respectively, each of the memory cells including an upper electrode and a lower electrode; and
a plurality of interface layers located between the lower electrodes of the memory cells and the row lines, each of the interface layers having a first width narrower than a second width of each of the row lines,
wherein the second width of each of the row lines is narrower than a third width of the lower electrode.

2. The electronic device of claim 1, wherein the first width of each of the interface layers is narrower than the third width of the lower electrode.

3. The electronic device of claim 1, wherein a lower surface of the lower electrode has the third width wider than a fourth width of an upper surface of the lower electrode, and the first width of each of the interface layers is narrower than the third width of the lower surface of the lower electrode.

4. The electronic device of claim 1, wherein a lower surface of the lower electrode has the third width wider than a fourth width of an upper surface of the lower electrode, and the first width of each of the interface layers is narrower than the fourth width of the upper surface of the lower electrode.

5. The electronic device of claim 1, wherein each of the memory cells further includes a variable resistance layer located between the upper electrode and the lower electrode, and the first width of each of the interface layers is narrower than a fifth width of the variable resistance layer.

6. The electronic device of claim 1, wherein each of the memory cells further includes a variable resistance layer, an intermediate electrode, and a switching layer, the variable resistance layer, the intermediate electrode, and the switching layer being stacked between the lower electrode and the upper electrode, and the first width of each of the interface layers is narrower than a fifth width of the switching layer.

7. The electronic device of claim 1, wherein the interface layers include tungsten silicon nitride (WSiNx), and the row lines include tungsten (W).

8. The electronic device of claim 1, wherein the row lines each extend in a first direction, the column lines each extend in a second direction intersecting the first direction, the first width of each of the interface layers in the second direction is narrower than the second width of each of the row lines in the second direction, and the first width is narrower than the third width of the lower electrode in the second direction.

9. The electronic device of claim 1, wherein the row lines each extend in a first direction, the column lines each extend in a second direction intersecting the first direction, and the interface layers each extend in the first direction.

10. The electronic device of claim 9, wherein an upper surface of each of the interface layers includes a groove that is located between adjacent memory cells in the first direction.

11. The electronic device of claim 1, wherein the interface layers are located in the intersection regions, respectively.

12. The electronic device of claim 1, wherein the row lines each extend in a first direction, the column lines each extend in a second direction intersecting the first direction, and a distance between adjacent interface layers in the second direction is wider than that between adjacent row lines in the second direction.

13. The electronic device of claim 1, wherein the row lines each extend in a first direction, the column lines each extend in a second direction intersecting the first direction, and a distance between adjacent interface layers in the second direction is wider than that between adjacent memory cells in the second direction.

14. The electronic device of claim 1, wherein the row lines each extend in a first direction, the column lines each extend in a second direction intersecting the first direction, and the second width of each of the row lines in the second direction is narrower than the third width of the lower electrode in the second direction.

15. An electronic device comprising a semiconductor memory, wherein the semiconductor memory includes:
a plurality of row lines;
a plurality of column lines intersecting the row lines;

a plurality of memory cells located in a plurality of intersection regions of the row lines and the column lines, respectively, each of the memory cells including an upper electrode and a lower electrode; and a plurality of interface layers located between the lower electrodes of the memory cells and the row lines, the interface layers including a material having an etching rate higher than that of the row lines.

16. The electronic device of claim 15, wherein the interface layers each have a width narrower than that of each of the row lines.

17. The electronic device of claim 15, wherein each of the interface layers has a width narrower than that of the lower electrode.

18. The electronic device of claim 15, wherein a distance between adjacent interface layers in one direction is greater than that between adjacent row lines in the one direction.

19. The electronic device of claim 15, wherein each of the interface layers extends in one direction and includes a first portion disposed between the lower electrode and a corresponding one of the row lines and a second portion located between adjacent memory cells in the one direction, and wherein the second portion includes a groove.

20. An electronic device comprising a semiconductor memory, wherein the semiconductor memory includes:

a plurality of row lines;

a plurality of column lines intersecting the row lines;

a plurality of memory cells located in a plurality of intersection regions of the row lines and the column lines, respectively, each of the memory cells including an upper electrode and a lower electrode; and a plurality of interface layers located between the lower electrodes of the memory cells and the row lines, each of the interface layers having a first width narrower than a second width of a corresponding one of the row lines, wherein at least one of the row lines has a rounded edge.

* * * * *